United States Patent
Dolechek et al.

(10) Patent No.: US 7,060,138 B2
(45) Date of Patent: Jun. 13, 2006

(54) METHODS FOR CLEANING WAFER CONTAINERS

(75) Inventors: Kert Dolechek, Kalispell, MT (US); Jeffry Davis, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 0 days.

(21) Appl. No.: 10/917,750

(22) Filed: Aug. 12, 2004

(65) Prior Publication Data

US 2005/0011540 A1    Jan. 20, 2005

Related U.S. Application Data

(62) Division of application No. 10/286,317, filed on Nov. 1, 2002, now Pat. No. 6,830,057.

(51) Int. Cl.
*B08B 3/02* (2006.01)

(52) U.S. Cl. .......................................... 134/33; 134/37

(58) Field of Classification Search ................ 134/32, 134/33, 37, 22.1, 25.1
See application file for complete search history.

(56) References Cited

U.S. PATENT DOCUMENTS

| | | | |
|---|---|---|---|
| 3,620,234 A | 11/1971 | Everroad | |
| 4,299,245 A | 11/1981 | Clapper | |
| 4,437,479 A | 3/1984 | Bardina et al. | |
| 4,736,759 A | 4/1988 | Coberly et al. | |
| 4,941,489 A | 7/1990 | Kamimura et al. | |
| 5,022,419 A | 6/1991 | Thompson | |
| 5,238,503 A | 8/1993 | Phenix et al. | |
| 5,271,774 A | 12/1993 | Leenaars et al. | |
| 5,301,700 A | 4/1994 | Kamikawa et al. | |
| 5,363,867 A | 11/1994 | Kawano et al. | |
| 5,562,113 A | 10/1996 | Thompson | |
| 5,698,038 A | 12/1997 | Guldi et al. | |
| 5,715,851 A | 2/1998 | Jung et al. | |
| 5,738,128 A * | 4/1998 | Thompson et al. | 134/95.2 |
| 5,972,127 A | 10/1999 | Thompson et al. | |
| 6,096,100 A | 8/2000 | Guldi et al. | |
| 6,248,177 B1 | 6/2001 | Halbmaier | |
| 6,267,123 B1 | 7/2001 | Yoshikawa | |
| 6,279,724 B1 * | 8/2001 | Davis | 198/465.2 |
| 6,322,633 B1 * | 11/2001 | Bexten et al. | 134/1 |
| 6,358,328 B1 | 3/2002 | Yang et al. | |
| 6,412,502 B1 | 7/2002 | Bexten et al. | |
| 6,432,214 B1 * | 8/2002 | Bryer et al. | 134/10 |
| 6,446,647 B1 | 9/2002 | Chu et al. | |
| 6,797,076 B1 * | 9/2004 | Bryer | 134/33 |

FOREIGN PATENT DOCUMENTS

| | | |
|---|---|---|
| JP | 61-164225 | 7/1986 |
| JP | 61-166134 | 7/1986 |
| JP | 01-111338 | 4/1989 |
| JP | 01-199431 | 8/1989 |

* cited by examiner

*Primary Examiner*—Michael Barr
*Assistant Examiner*—Saeed Chaudhry
(74) *Attorney, Agent, or Firm*—Perkins Coie LLP

(57) ABSTRACT

A system and method for cleaning boxes used for handling flat media includes a rotor rotatably mounted within an enclosure, with spray nozzles in the enclosure for spraying fluid toward the rotor. The rotor has at least one box holder assembly for holding a box. At least one retainer bar is located on the rotor for engaging a front section of the box to retain the box in the box holder assembly during rotation of the rotor. The retainer bar is preferably moveable from a first position where the retainer bar restrains the box on the box holder assembly, to a second position where the retainer bar is moved away from the box. The box holder assembly may alternatively include a base with a plurality of grooved elements thereon that are adapted to engage a flange on the box for securing the box to the box holder assembly.

22 Claims, 4 Drawing Sheets

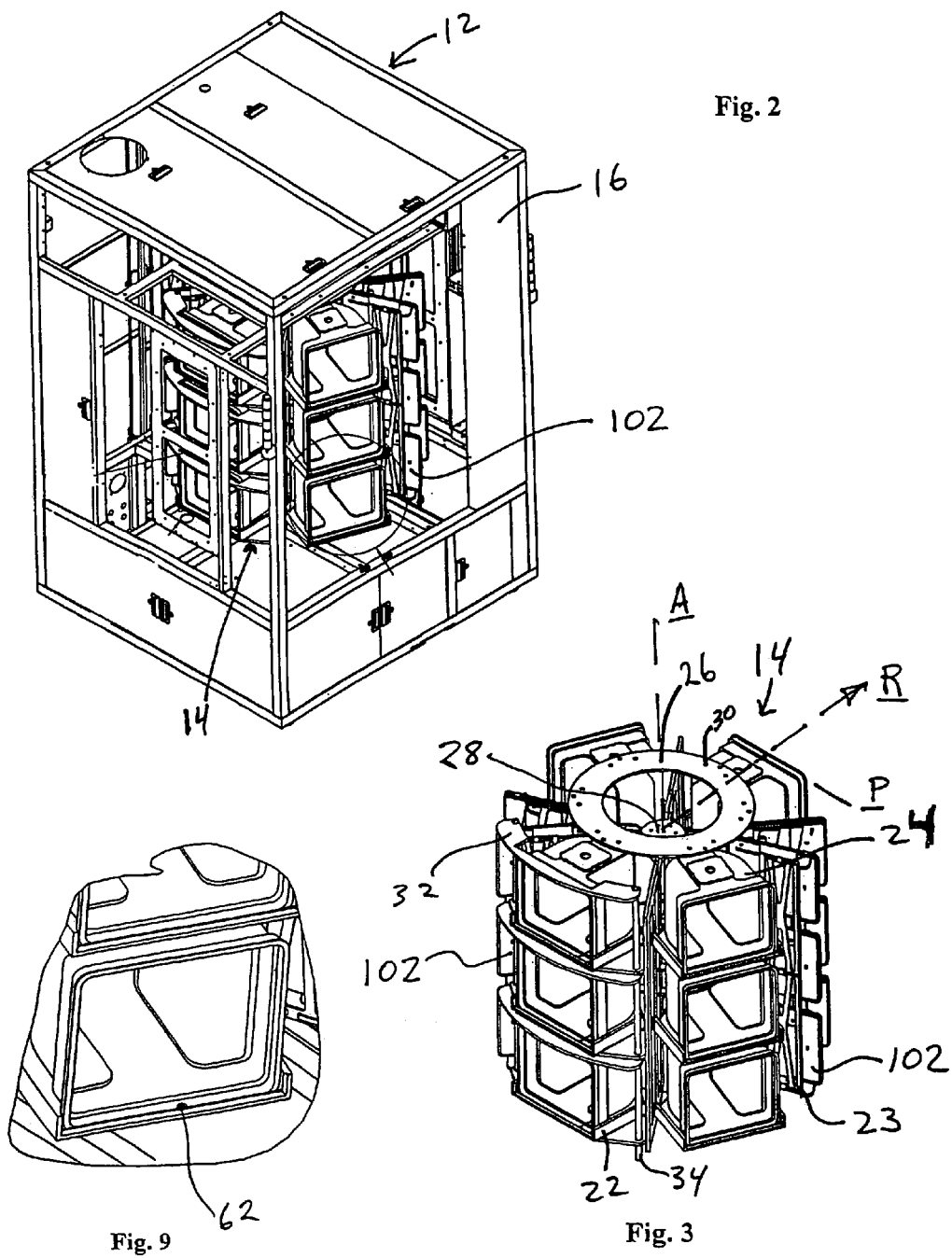

METHODS FOR CLEANING WAFER CONTAINERS

PRIORITY CLAIM

This application is a division of U.S. patent application Ser. No. 10/286,317, filed Nov. 11, 2002, now U.S. Pat. No. 6,830,057, and incorporated herein by reference.

BACKGROUND OF THE INVENTION

The field of the invention is cleaning apparatus for cleaning carriers used to hold and transport semiconductor wafers and similar flat articles requiring low contamination levels.

The processing of semiconductor wafers, substrates, photomasks, flat panel displays, data disks, optical and MEMS media and other flat articles (collectively referred to here as "wafers") is very sensitive to contamination. These articles require extremely low contamination levels. Even microscopic contaminants can cause defects. Accordingly, it is necessary to maintain a high level of cleanliness during virtually all stages of manufacture.

Wafers are typically processed in batches. Batch handling may occur throughout the entire production process, or for one or more processing steps or related handling operations. Batch processing usually uses a carrier to hold the wafers. The wafer carriers can be of various designs and are generally a protective case or box optionally including a removable door. These carriers or boxes are known as FOUPs, FOSBYs or cassettes. In these types of carriers, the wafers are held and enclosed, to protect them from contamination during movement and storage within the processing facility. After each use, the wafer carriers must generally be cleaned to avoid having particles and contaminants on the carriers contaminate the wafers. Cleaning the boxes, however, can be difficult because they typically have features such as slots, grooves, and/or apertures.

Carriers have been successfully cleaned in centrifugal cleaners. See, for example, U.S. Pat. No. 5,738,128 incorporated herein by reference. In these centrifugal cleaners, the box is loaded onto a rotor, with the open front side of the box facing radially outwardly from the rotor. The box is then sprayed with cleaning fluids, and then with drying gases, while the rotor turns. Centrifugal force helps to remove cleaning fluids from the box, to help dry it. While these techniques have worked well for different types of boxes, disadvantages remain in loading, holding and unloading especially larger size carriers.

Another engineering challenge is that carrier doors in current systems are generally cleaned separately from the boxes themselves. Accordingly, matching the doors back with their respective boxes after cleaning is often difficult, error prone, and time consuming. Thus, there is a need for a system that efficiently cleans carriers, as well as a system that cleans carriers and carrier doors together.

SUMMARY OF THE INVENTION

In a first aspect of the invention, a system for cleaning carriers used for holding flat media or wafers includes a rotor rotatably mounted within an enclosure. Spray nozzles in the enclosure spray fluid toward the rotor. The rotor has at least one box holder assembly for holding a box, such as a FOUP or FOSBY. At least one retainer bar is located on the rotor for engaging a front section of the box to retain the box in the box holder assembly during rotation of the rotor. In a preferred embodiment, the retainer bar is moveable from a first position where the retainer bar restrains the box on the box holder assembly, to a second position where the retainer bar is moved away from the box. This design provides for quick, reliable and ergonomic loading, securing and unloading of boxes.

In a second aspect of the invention, a method of cleaning a box used for handling flat media includes loading a box into a box holder assembly on a rotor preferably via handles on the box. A retainer bar is then moved into engagement with the box to secure the box into the box holder assembly before rotating and spraying the box. The boxes are securely held in the rotor.

In a third aspect of the invention, a method of cleaning a carrier having a box with a removable door includes separating the door from the box and loading the box into a box holder assembly on a rotor. The door is then loaded into a door holder assembly attached to and alongside of the box holder assembly. Since each door remains next to its box at all times, matching doors and boxes after cleaning is greatly simplified.

In a fourth aspect of the invention, a rotor for holding and rotating boxes during cleaning of the boxes includes a top plate and a base plate. A plurality of box holder assemblies are located between the top plate and the bottom plate. Each box holder assembly includes a base plate or other means for holding a box, and a door plate or other means for holding a door, with the door plate attached to the base plate. Each box door is cleaned while remaining adjacent to the box the door came from.

Other and further objects, inventive features, and advantages, will appear hereinafter. The invention resides as well in subsystems and subcombinations of the features described. While various additional elements are discussed in the following detailed description, these elements are not essential to the invention.

BRIEF DESCRIPTION OF THE DRAWINGS

In the drawings, wherein the same reference number denotes the same element, throughout the several views:

FIG. 2 is a perspective view of a rotor within the box cleaning system shown in FIG. 1.

FIG. 3 is a perspective view of the rotor shown in FIG. 2.

FIG. 9 is a close-up view of a carrier box with a sensor thereon.

DETAILED DESCRIPTION OF THE DRAWINGS

Figure 1:
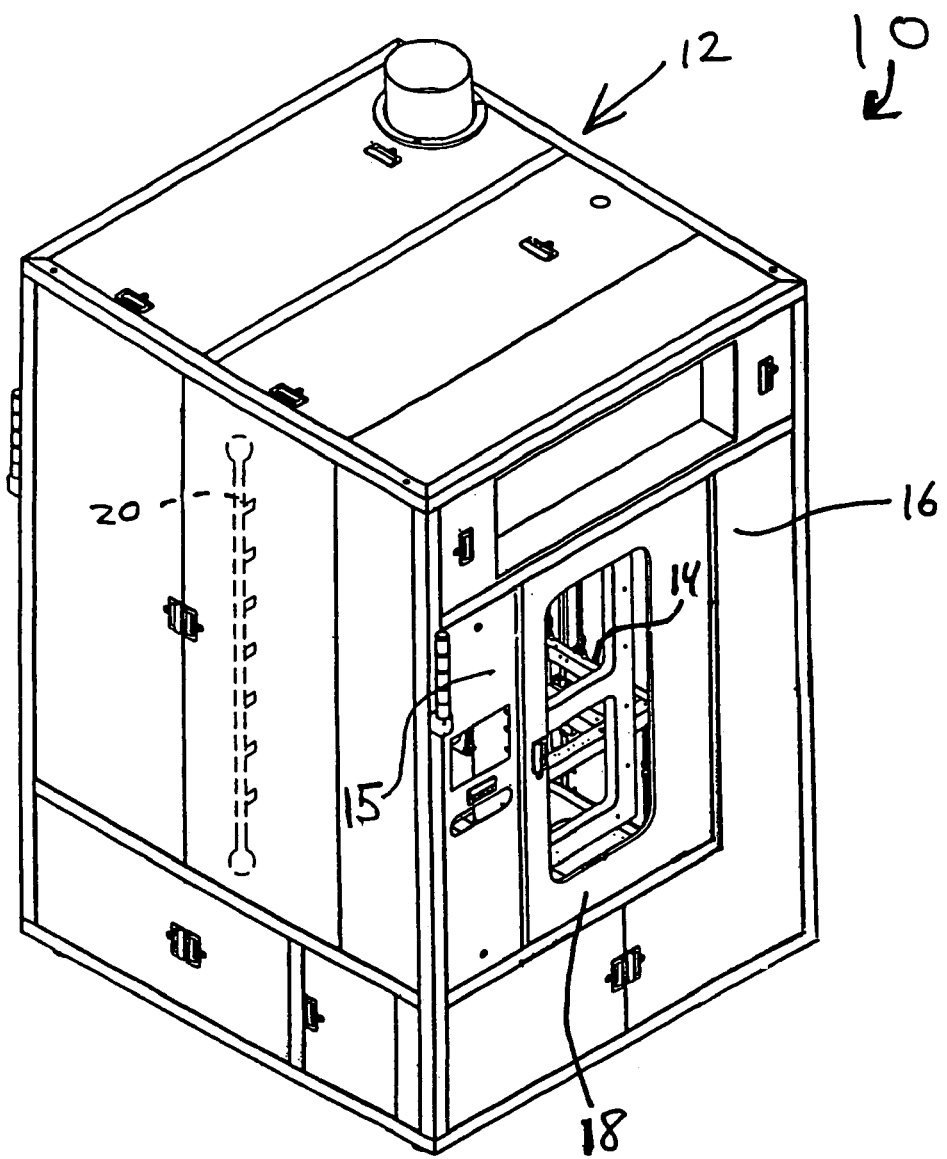
FIG. 1 is a perspective view of a system for cleaning carrier boxes used in handling wafers and similar flat articles.

Turning now in detail to the drawings, as shown in FIG. 1, a carrier cleaning system 10 includes a centrifugal box cleaner 12 for cleaning carriers, such as FOUP carriers. A carrier door cleaner may be provided separately, or may be included in the centrifugal cleaner 12, as described below.

A rotor assembly 14 is rotatably supported within an enclosure 16 of the box cleaner 12. The rotor assembly 14 is accessed via an enclosure door 18, which slides or pivots open for loading and unloading, and is closed during cleaning. At least one spray manifold 20 (shown in phantom in FIG. 1), including one or more spray nozzles, is located in the enclosure for spraying fluid toward the rotor to clean and rinse carrier boxes supported on the rotor. Typically each manifold will have many nozzles, and several inner and outer manifolds are provided.

Turning to FIGS. 2 and 3, the rotor assembly 14 is shown within the enclosure 16 and in isolation. The rotor assembly 14 includes a plurality of radially outwardly facing box holder assemblies 22 each having preferably 2, 3, 4 or more vertically stacked up. In FIGS. 2 and 3, the rotor assembly 14 is shown having four columns of box holder assemblies, with each column including three box holder assemblies 22, for supporting a total of twelve carrier boxes 24. For example, the top box holder assembly in each column may be eliminated to provide a shorter rotor assembly, such that the rotor assembly includes a total of eight box holder assemblies 22 (i.e., four columns each having two box holder assemblies).

The box holder assemblies 22 are attached to, and form part of, the rotor assembly 14 within the box cleaner 12. The rotor assembly 14 has a top ring plate 26 and a bottom ring plate (not visible in the drawings) attached to a core structure 28. The box holder assemblies 22 are rigidly attached to the ring plates via bolts 30, screws, or other suitable attachment means.

Door holding ladders or frames are also attached to the ring plates 26. Each door holding ladder 23 has positions for holding a door of a carrier. Each ladder 23 is preferably adjacent to a box bolder assembly, to simplify matching up doors and boxes after cleaning.

Figure 5:
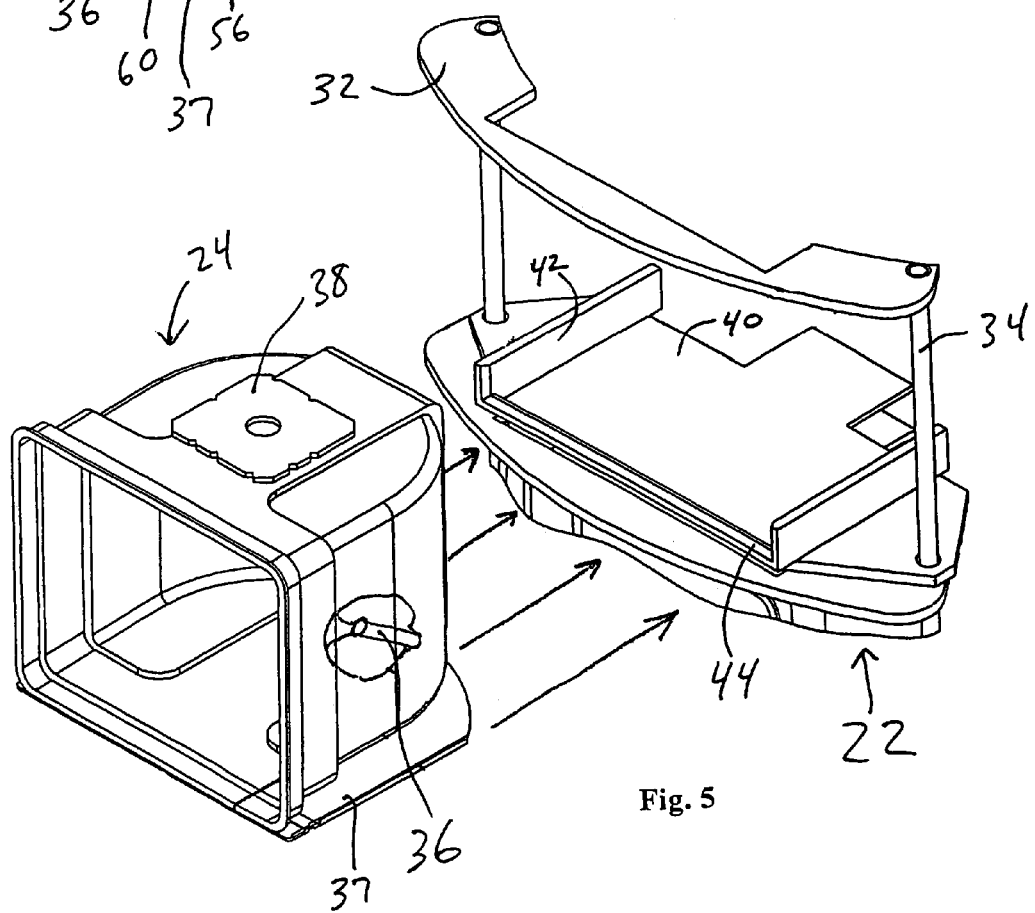
FIG. 5 is a perspective view of a first preferred loading sequence of a carrier box moving into a box holder assembly.

As is best illustrated in FIG. 5, each box holder assembly 22 preferably includes a base plate 40 attached to the rotor assembly 14 via welds, screws, or other suitable attachment means. The base plate 40 has a pair of vertically extending side guides 42 for guiding a carrier box 24 into the box holder assembly 22. The base plate 40 further includes a raised lip 44 at a front section thereof for holding a box 24 on the box holder assembly 22, and for preventing clocking or angular shifting of the box 24 about an axis, during rotation of the rotor assembly 14.

Figure 7:
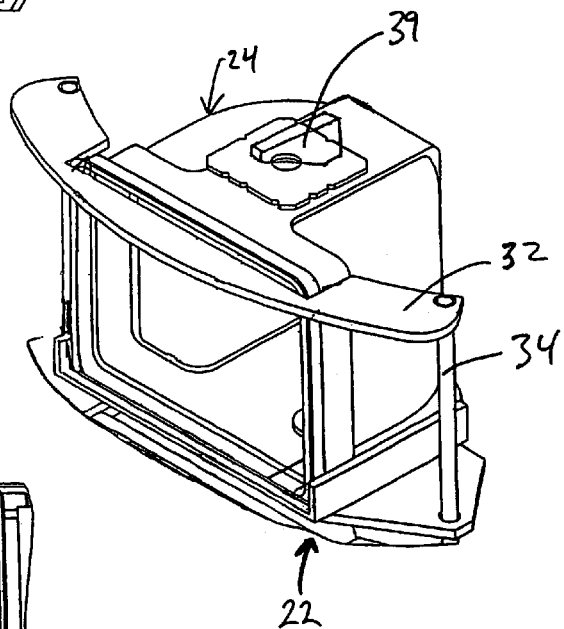
FIG. 7 is a perspective view of a carrier box secured in a box holder assembly.

The rotor assembly 14 includes a retainer mechanism for securing boxes 24 to their respective box holder assemblies 22 during rotation of the rotor assembly 14. The retainer mechanism includes a plurality of retainer plates or bars 32, with one retainer bar 32 aligned over each box holder assembly 22 on the rotor assembly 14. In a preferred embodiment, each retainer bar 32 is substantially C-shaped so that it may engage three sides of a box 24, as illustrated in FIG. 7, thereby constraining the box 24 in three directions during rotation of the rotor assembly 14.

Figure 6:
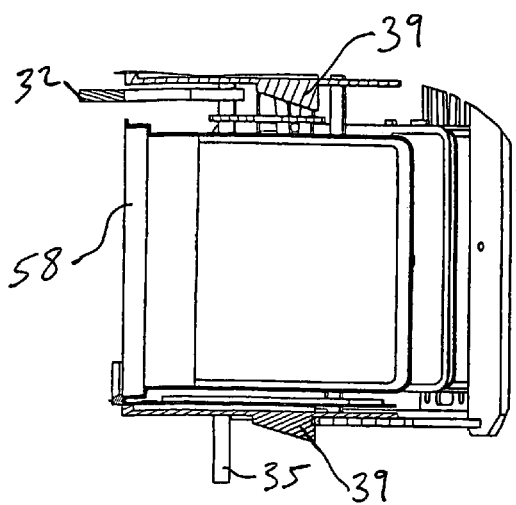
FIG. 6 is a side view of a carrier box loaded into an open box holder assembly on a lower level of a rotor.

Each retainer bar 32 is preferably attached to a pair of vertically extending arms 34 located on opposite sides of each column of box holder assemblies 22. The retainer mechanism is preferably raised and lowered by an actuator 35, which is located at the bottom of the rotor assembly 14, as illustrated in FIG. 6. In a preferred embodiment, the actuator 35 engages the retainer mechanism via a sealed passthrough shaft and receiver. Alternatively, each retainer bar can be separately moved by hand.

The rotor assembly 14 further includes an angled guide 39 attached thereto and positioned above each box holder assembly 22. The angled guide 39 is located between the retainer bar 32 and the central axis of the rotor assembly 14 such that, 24 when a box 24 is positioned on the box holder assembly 22, the angled guide 39 is aligned over the top of the box 24, as illustrated in FIG. 7. The angled guide 39 accordingly, limits or prevents upward movement of the box 24 after the box 34 is placed into the box holder assembly.

The rotor assembly 14 preferably includes one or more sensors for indicating when boxes 24 are properly loaded and retained in the box holder assemblies 22. Sensors may also be positioned on the rotor assembly 14 to indicate when a box holder assembly 22 is open for loading/unloading a carrier box 24, or closed for cleaning a box 24. As illustrated in FIG. 9, one or more sensors 62 may additionally be located on or in each of the box holder assemblies 22 to indicate whether or not a box 24 is present and/or properly positioned in the box holder assembly 22. Conventional laser sensors, or other suitable sensing devices, may be employed to perform these sensing functions.

Figure 4:
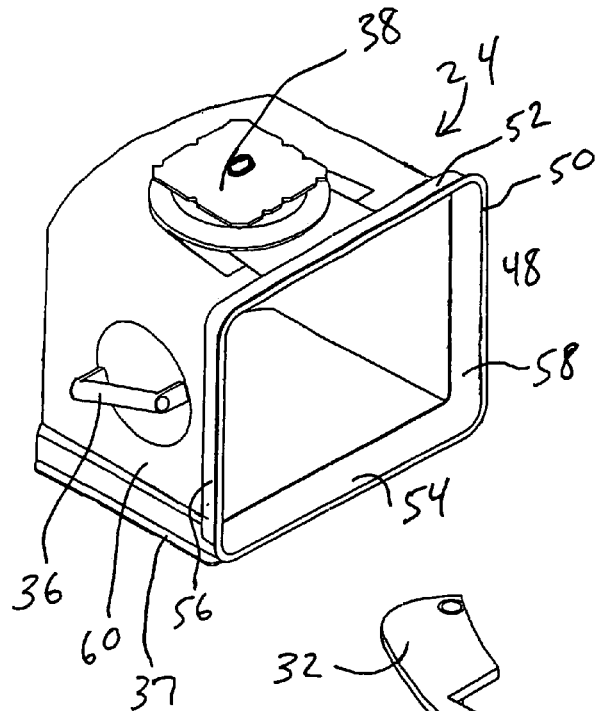
FIG. 4 is a perspective view of a carrier box.

A variety of standard carriers used in the semiconductor wafer processing industry, such as FOUP carriers, may be cleaned in the rotor assembly 14. The box component of the carrier 24, as illustrated in FIGS. 4 and 5, has an open front 48 surrounded by a frame 50. The frame 50 has a top rim 52, a bottom rim 54, a left side rim 56, and a right side rim 58. Handles 36 are attached to side walls 60 of the carrier box 24. A flange 37 forms the base of the carrier box 24. A fitting 38 may be attached to the top surface of the carrier box 24, for engagement by a robot or other automatic manipulator. The door component of the carrier is generally flat and has moveable lugs or fittings which engage and disengage with matching features on the box.

In use, carriers 24 to be cleaned are transported to the container cleaning system 10. A system (human) operator typically lifts a carrier box 24 from a cart and removes the door from the carrier box 24. To load the carrier 24 into the box cleaner 12, the operator turns the rotor assembly 14, via a control panel, until an empty box holder assembly 22 is aligned with the opening of the enclosure door 18. The enclosure door slides open and closed automatically via operator control of the control panel.

The operator, preferably holding the carrier box 24 by the handles 36, then slides the carrier box 24 over the lip 44 and between the side guides 42 of the box holder assembly 22, in the direction shown in FIG. 5. Once the carrier box 24 clears the lip 44 and comes to rest on the base plate 40, as illustrated in FIG. 6, additional carrier boxes 24 may be loaded into the remaining open box holder assemblies 22.

Figure 8:
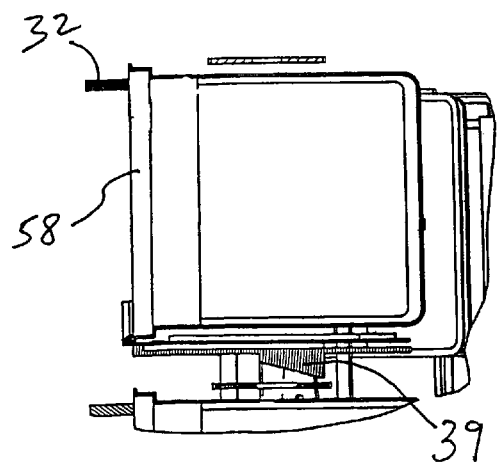
FIG. 8 is a side view of a carrier box secured in a box holder assembly on an upper level of a rotor assembly.

Once the box holder assemblies 22 are loaded with carrier boxes 24, the operator, via the actuator 35, lowers the retaining mechanism. Each retainer bar 32 engages the top of the frame 50 of its respective carrier box 24, as illustrated in FIGS. 7 and 8. In a preferred embodiment, the retainer bar 32 engages the front face and the side rims 56, 58 of the carrier box 24, as illustrated in FIG. 7. The carrier box 24 is preferably further engaged by the side guides 42 and the lip 44 on the base 40, and by the angled guide 39 above on the rotor assembly 14. Accordingly, the carrier box 24 is secured into the box holder assembly 22 such that it cannot shift during subsequent rotation of the rotor assembly 14. The rotor is then indexed or rotated to align a next set of holder assemblies 22 with the door. This procedure continues until the rotor is preferably fully loaded.

Before starting the cleaning process, the operator checks to ensure that none of the carrier boxes 24 are loaded improperly, preferably via the sensors on the rotor assembly 14 and/or on the box holder assemblies. If a carrier box 24 is loaded improperly, such that it protrudes out of the box holder assembly 22, for example, the operator can then adjust the box 24 by hand.

When each of the box holder assemblies 22 is properly loaded with a carrier box 24, or when there are no further boxes 24 to be cleaned, the operator closes the enclosure door 18 and initiates the cleaning sequence via a control panel 15. The rotor assembly 14 spins and cleaning fluids (typically water optionally including detergent) are sprayed onto the carrier boxes 24. Heated air, optionally along with drying gases may then be used to dry the carrier boxes 22, as described, for example, in U.S. Pat. No. 5,738,128. After the carrier boxes 24 have been cleaned and dried, they are unloaded and removed from the box cleaner 12 following the reverse of the sequence of steps described above.

The doors of the box carriers 24 may be cleaned in a separate cleaning apparatus, such as the centrifugal cleaner described in U.S. Pat. No. 6,412,502, incorporated herein by reference. The doors may then be matched up with their after cleaning respective carrier boxes. Generally, each door should be returned and attached to the box it came off of.

While embodiments and applications of the present invention have been shown and described, it will be apparent to one skilled in the art that other modifications are possible without departing from the inventive concepts herein. The invention, therefore, is not to be restricted except to the following claims and their equivalents.

The invention claimed is:

1. A method of cleaning a box used for holding flat media, comprising:
    loading the box into a box holder on a rotor;
    moving a retainer into a position where the retainer holds the box in place on the rotor;
    rotating the rotor; and
    applying a cleaning fluid onto the box.

2. The method of claim 1 where the retainer includes a bar that engages a front surface of the box.

3. The method of claim 2 where the retainer bar also is engageable to at least one side of the box.

4. The method of claim 1 where the retainer includes a substantially C-shaped bar engageable with a front surface of the box and left or right sides of the box.

5. The method of claim 1 further comprising guiding the box into the box holder via a guide attached to the rotor above the box holder, with the guide engageable against a top surface of the box.

6. The method of claim 1 further comprising flowing a drying gas over the box after spraying the box.

7. The method of claim 1 further including enclosing the rotor within an enclosure and spraying the cleaning fluid onto the box.

8. The method of claim 1 including the step of moving the retainer substantially in a downward direction to hold the box in place as the rotor spins, and moving the retainer substantially in a upward direction, to release the retainer from the box.

9. The method of claim 1 further comprising sensing the presence of a box on the rotor.

10. The method of claim 1 further comprising sensing whether a box is properly loaded into the rotor.

11. The method of claim 1 further comprising loading a box door onto the rotor, with the box door in a vertical orientation.

12. The method of claim 1 where the retainer is moveable from a first position where the retainer holds the box into the box holder, to a second position where the retainer is moved away from the box.

13. The method of claim 1 further including preventing substantial angular shifting of the box by holding a lower front edge of the box against a lip on the rotor.

14. The method of claim 1 further comprising guiding the box into the box holder using side guides on the rotor.

15. The method of claim 1 further comprising raising and lowering the retainer via an actuator.

16. The method of claim 1 further including holding the box on a base plate on the rotor.

17. A method of cleaning a box used for holding wafers, comprising:
    loading the box onto a rotor of a box cleaning machine;
    moving a retainer into a position for engaging a front surface of the box, to hold the box in place;
    rotating the rotor; and
    applying a cleaning fluid onto the box.

18. The method of claim 17 with the retainer also preventing any substantial lateral movement of the box by moving into a position with part of the retainer alongside of a left side and right side of the box.

19. The method of claim 17 including the step of moving the retainer linearly substantially in a downward direction to engage the retainer onto the box, and moving the retainer linearly substantially in a upward direction, to release the retainer from the box.

20. The method of claim 17 further comprising loading a box door onto the rotor, with the box door in a vertical orientation.

21. A method of cleaning a box used for holding wafers, comprising:
    loading the box into a box holding position on a rotor of a box cleaning machine;
    loading a box door into a door holding position on the rotor;
    moving a retainer into a position around the box, to prevent the box from moving out of the box holding position;
    rotating the rotor; and
    applying a cleaning fluid onto the box.

22. The method of claim 21 including the step of moving the retainer linearly substantially in a downward direction, to a position where the retainer largely prevents outward radial movement of the box, and moving the retainer linearly substantially in a upward direction, to allow loading and unloading of the box into and out of the box holding position.

* * * * *